US007978467B2

(12) United States Patent
Ichikawa

(10) Patent No.: US 7,978,467 B2
(45) Date of Patent: Jul. 12, 2011

(54) KEY SHEET, PRESS SWITCH AND ELECTRONIC DEVICE PROVIDED WITH THE PRESS SWITCH

(75) Inventor: Yohei Ichikawa, Kanagawa (JP)

(73) Assignee: Panasonic Corporation, Osaka (JP)

( * ) Notice: Subject to any disclaimer, the term of this patent is extended or adjusted under 35 U.S.C. 154(b) by 69 days.

(21) Appl. No.: 12/525,757

(22) PCT Filed: Feb. 5, 2007

(86) PCT No.: PCT/JP2007/051901

§ 371 (c)(1),
(2), (4) Date: Aug. 4, 2009

(87) PCT Pub. No.: WO2008/096406

PCT Pub. Date: Aug. 14, 2008

(65) Prior Publication Data

US 2010/0101927 A1 Apr. 29, 2010

(51) Int. Cl.
*H05K 7/20* (2006.01)
*H01H 3/12* (2006.01)

(52) U.S. Cl. .............. 361/679.54; 361/679.46; 361/704; 361/705; 200/5 A; 200/314; 200/341

(58) Field of Classification Search ............. 361/679.01, 361/679.08, 679.09, 679.46, 679.54, 702–714; 200/5 A, 310–314, 341–345, 512; 174/16.3, 174/252; 165/80.3, 104.33, 185
See application file for complete search history.

(56) References Cited

U.S. PATENT DOCUMENTS

| | | | | | |
|---|---|---|---|---|---|
| 5,557,079 | A | * | 9/1996 | Jackson et al. | 200/5 A |
| 5,661,279 | A | * | 8/1997 | Kenmochi | 200/314 |
| 5,924,555 | A | * | 7/1999 | Sadamori et al. | 200/512 |
| 5,986,503 | A | * | 11/1999 | Ichikawa | 330/277 |
| 5,990,736 | A | * | 11/1999 | Nasuno et al. | 330/66 |
| 6,180,895 | B1 | * | 1/2001 | Hutchinson et al. | 200/5 A |
| 6,572,960 | B2 | * | 6/2003 | Amon | 428/315.9 |
| 6,967,292 | B2 | * | 11/2005 | Nishimura | 200/5 A |
| 7,034,235 | B2 | * | 4/2006 | Hosaka | 200/314 |
| 7,262,379 | B2 | * | 8/2007 | Nishimura et al. | 200/314 |

(Continued)

FOREIGN PATENT DOCUMENTS

EP 1775741 A1 4/2007

(Continued)

OTHER PUBLICATIONS

International Search Report dated Mar. 13, 2007.

(Continued)

*Primary Examiner* — Michael V Datskovskiy
(74) *Attorney, Agent, or Firm* — Pearne & Gordon LLP

(57) ABSTRACT

It is an object of the present invention to provide a key sheet and the like which can suppress local elevation of temperature, and effectively diffuse heat loss from electronic circuits. The key sheet includes: a viscoelastic sheet 16*b* having a viscoelastic property, and having a first surface and a second surface; a button section 16*a* located on the side of the first surface of the viscoelastic sheet 16*b*; a thermally-conductive sheet 14 located along the first surface or the second surface of the viscoelastic sheet 16*b*, the thermally-conductive sheet 14 having a thermal conductivity equal to a specific value; and a contact section 16*d* projected from the second surface of the viscoelastic sheet 16*b*, the contact section occupies a position corresponding to the button section 16*a*.

15 Claims, 14 Drawing Sheets

U.S. PATENT DOCUMENTS

| | | | | |
|---|---|---|---|---|
| 7,292,441 | B2 * | 11/2007 | Smalc et al. | 361/704 |
| 7,330,354 | B2 * | 2/2008 | Watanabe | 361/705 |
| 7,358,454 | B2 * | 4/2008 | Senzui | 200/341 |
| 7,361,859 | B2 * | 4/2008 | Yoshioka et al. | 200/341 |
| 7,378,607 | B2 * | 5/2008 | Koyano et al. | 200/341 |
| 7,394,038 | B2 * | 7/2008 | Chang | 200/341 |
| 7,427,725 | B2 * | 9/2008 | Hou et al. | 200/512 |
| 7,485,822 | B2 * | 2/2009 | Koyano et al. | 200/341 |
| 7,522,419 | B2 * | 4/2009 | Huang et al. | 361/704 |
| 7,538,286 | B2 * | 5/2009 | Yoshioka | 200/341 |
| 7,655,878 | B2 * | 2/2010 | Nishimura | 200/512 |
| 2007/0084709 | A1 * | 4/2007 | Koyano et al. | 200/341 |
| 2007/0084710 | A1 * | 4/2007 | Koyano et al. | 200/341 |
| 2008/0093961 | A1 * | 4/2008 | Koyano et al. | 313/11 |
| 2009/0057121 | A1 * | 3/2009 | Yoshida et al. | 200/5 A |
| 2009/0090607 | A1 * | 4/2009 | Ichikawa et al. | 200/341 |

FOREIGN PATENT DOCUMENTS

| | | | | |
|---|---|---|---|---|
| EP | 1775742 | A1 | | 4/2007 |
| JP | 61-243622 | A | | 10/1986 |
| JP | 5-298961 | A | | 11/1993 |
| JP | 2000-148307 | A | | 5/2000 |
| JP | 02004303493 | A | * | 10/2004 |
| JP | 2004-311332 | A | | 11/2004 |

OTHER PUBLICATIONS

Supplementary European Search Report for Appl. EP 07708019 dated Jun. 11, 2010 .

* cited by examiner (a)

(b)

(a)

(b)

| Material of Thermally-Conductive Sheet | Thickness (Z-axis Direction) | Thermal Conductivity in a direction parallel to the plane (X- and Y-axes) |
|---|---|---|
| Graphite | 100 μm | 700(W/(m·K)) |
| | 70 μm | 850(W/(m·K)) |
| | 25 μm | 1600(W/(m·K)) |
| Aluminum | – | 237(W/(m·K)) |
| Copper | – | 398(W/(m·K)) |

(a)

(b)

KEY SHEET, PRESS SWITCH AND ELECTRONIC DEVICE PROVIDED WITH THE PRESS SWITCH

TECHNICAL FIELD

The present invention relates to a key sheet, a press switch and an electronic device provided with the key sheet, and more particularly to a key sheet improved in heat radiation performance as an element useful for a portable electronic device, a press switch, and an electronic device provided with the key sheet.

BACKGROUND OF THE INVENTION

In recent years, an electronic device or more specifically a portable electronic device has been needed to be improved in size, thickness and function. Therefore, it is necessary to enhance the density of electronic components to be mounted on a printed-circuit board of the portable electronic device, and to improve the portable electronic device in heat radiation performance.

As shown in FIGS. 13 to 15, the portable electronic device of this type is exemplified by a mobile phone. As shown in FIG. 13, the electronic device 100 includes a lower housing 103, an upper housing 105, and a hinge unit 104 for connecting the lower housing 17 with the upper housing 105 to allow opening and closing movements of the lower housing 17 and the upper housing 105. The lower housing 103 has an operation input unit 102 and a sound input unit 103 accommodated therein, while the upper housing 104 has a screen 106 and a sound output unit 107 accommodated therein.

The lower housing 101 has a front member 101*a* and a rear member 101*b*. As shown in FIG. 14, a printed-circuit board 121 for communications and input/output control, and a key sheet 122 having an elastic sheet section 122*a* retain key tops 122*b*, 122*c*, and 122*d*, and a flexible electrically-insulating sheet 123. When the key tops 122*b*, 122*c*, and 122*d* are operated, the press switches corresponding to the key tops 122*b*, 122*c*, and 122*d* selectively assume open and closed state (see FIG. 15).

More specifically, the flexible electrically-insulating sheet 123 has an area which corresponds to a key contact section 120, and has bores 125 as shown in FIG. 15. The flexible electrically-insulating sheet 123 includes a thermally-conductive sheet 123*a* constituted by a sheet made of electrically-nonconducting and thermally-conductive material, an electrically-conductive film 123*b* located on the opposite side of the thermally-conductive sheet 123*a* from the printed-circuit board 121, a resin sheet 123*c* located on the opposite side of the electrically-conductive film 123*b* from the thermally-conductive sheet 123*a*, and dome-shaped sections 124 constituted as switch elements corresponding to contact points 120 on the printed-circuit board 121, made of metal, and received in the bores 125 (see patent document 1). The above-mentioned press switch can diffuse heat loss from the electronic circuit 129 to avoid the temperature elevation of a surface for key operations on the side to be operated.

Patent document 1: Japanese Patent Laid-Open Publication 2006-310035

DISCLOSURE OF THE INVENTION

Problems to be Solved by the Invention

In the conventional press switch, the thermally-conductive sheet 123*a* is in contact with the printed-circuit board 121, and covered with the electrically-conductive film 123*b* and the key sheet 122. As a result, the conventional electronic device is increasingly reduced in heat radiation performance, and makes it difficult to diffuse heat loss from the electronic circuit 129. Further, the electrically-insulating sheet is generally low in heat conductivity in comparison with the thermally-conductive sheet. As a result, the conventional electronic device is further reduced in heat radiation performance by reason that the electrically-insulating sheet is used in the conventional electronic device.

It is therefore an object of the present invention to provide a key sheet, a press switch and an electronic device, each of which can prevent the housing the button section from being excessively heated by the electronic circuit by controlling and suppressing local elevation of temperature resulting from heat loss from the electronic circuit, and enhance heat radiation performance to effectively diffuse heat loss from the electronic circuit.

Means for Solving the Problems

The key sheet according to the present invention comprises: a viscoelastic sheet having a viscoelastic property, and having a first surface and a second surface; a button section located on the side of the first surface of the viscoelastic sheet; a thermally-conductive sheet located along the first surface or the second surface of the viscoelastic sheet, the thermally-conductive sheet having a thermal conductivity equal to a specific value; and a contact section projected from the second surface of the viscoelastic sheet, the contact section occupies a position corresponding to the button section.

The key sheet thus constructed is increased in heat radiation performance by reason that the key sheet is in the vicinity of the electronic components mounted on the printed-circuit board, and the thermally-conductive included in the key sheet is close to external air.

In the key sheet according to the present invention, the button section may include a first button section, a second button section, and a third button section which is not on a straight line passing through the first and second button sections, the thermally-conductive sheet is in an area identified by the first to third button sections.

The key sheet thus constructed can suppress local elevation of temperature to even the temperature distribution by reason that the thermally-conductive sheet is in an area identified by the first to third button sections.

In the key sheet according to the present invention, the thermally-conductive sheet may have a first surface and a second surface, the thermally-conductive sheet is located under the condition that the second surface of the thermally-conductive sheet is in contact with the first surface of the viscoelastic sheet.

Under the condition that the second surface of the thermally-conductive sheet is in contact with the first surface of the viscoelastic sheet, the key sheet according to the present invention may further comprise an electrically-insulating cover layer having an insulating property. The electrically-insulating cover layer is in contact with the viscoelastic sheet, and covers a peripheral section of the thermally-conductive sheet.

Under the condition that the second surface of the thermally-conductive sheet is in contact with the first surface of the viscoelastic sheet, in the key sheet according to the present invention, the thermally-conductive sheet may have an opening, the contact section occupies a position of the opening, and is in contact with the first surface of the viscoelastic sheet.

The button section can be illuminated by the LED mounted on the printed-circuit board.

Under the condition that the second surface of the thermally-conductive sheet is in contact with the first surface of the viscoelastic sheet, in the key sheet according to the present invention, the thermally-conductive sheet may have a character-shaped opening.

The button section can be illuminated through the character-shaped opening.

In the key sheet according to the present invention, the thermally-conductive sheet having a first surface and a second surface, the thermally-conductive sheet may be located under the condition that the first surface of the thermally-conductive sheet is in contact with the second surface of the viscoelastic sheet.

In the key sheet according to the present invention, the thermally-conductive sheet has an opening, the contact section may occupy a position of the opening, and may be in contact with the second surface of the viscoelastic sheet.

The key sheet according to the present invention may further comprise an electrically-insulating cover layer having an insulating property, the electrically-insulating cover layer is in contact with the viscoelastic sheet, and covers a peripheral section of the thermally-conductive sheet. The electrically-insulating cover layer may have a white or glossy-colored upper section. The electrically-insulating cover layer may be white or glossy.

In the key sheet according to the present invention, the electrically-insulating cover layer may have a visible light reflective property.

The key sheet thus constructed can guide visible light to a specific section in the housing to illuminate the button sections through the electrically-insulating cover layer without irregular color. In this case, the electrically-insulating cover layer may have a white or glossy-colored upper section. The electrically-insulating cover layer may be white or glossy.

In the key sheet according to the present invention, the thermally-conductive sheet may be constituted by a sheet made of graphite.

The press switch comprises: a printed-circuit board provided with an electronic circuit, the printed-circuit board having a first surface and a second surface; a switch section located on the first surface of the printed-circuit board, the switch section having a push point to change the connection state of the electronic circuit, and a key sheet defined in claim 1, and located in relation to the push point.

The press switch thus constructed can suppress local elevation of temperature to even the temperature distribution by reason that the thermally-conductive sheet is in an area identified by the first to third button sections.

In the press switch according to the present invention, the thermally-conductive sheet may be constituted by a sheet made of electrically-conductive material, and the printed-circuit board may have an electrically-conductive layer electrically connected to the thermally-conductive sheet.

The electronic device according to the present invention comprises the above press switch.

The electronic device thus constructed can suppress local elevation of temperature to even the temperature distribution by reason that the thermally-conductive sheet is in an area identified by the first to third button sections by reason that the heat radiation performance is increased by reason that the key sheet is in the vicinity of the electronic components mounted on the printed-circuit board, and the thermally-conductive included in the key sheet is close to external air.

The term "thermally-conductive sheet" is intended to indicate a sheet larger in thermal conductivity than the electrically-insulating cover layer and other members.

The following description is directed to specific values of thermal conductivity of the thermal conductive sheet. For example, the thermally-conductive sheet may be made of graphite, and may be set to 700 (W/(m·K)) in thermal conductivity on the surface of the thermally-conductive sheet (in X-Y direction) under the condition that the thermally-conductive sheet made of graphite is 100 μm in thickness (in Z-direction). The thermally-conductive sheet may be set to 850 (W/(m·K)) in thermal conductivity in any direction on the surface (in X-Y direction) under the condition that the thermally-conductive sheet made of graphite is 70 μm in thickness (in Z-direction). The thermally-conductive sheet made of graphite may be set to 1600 (W/(m·K)) in thermal conductivity in any direction on the surface (in X-Y direction) under the condition that the thermally-conductive sheet made of graphite is 25 μm in thickness (in Z-direction).

The thermally-conductive sheet may be made of aluminum, and may be set to 237 (W/(m·K)) in thermal conductivity on the surface of the thermally-conductive sheet (in X-Y direction). The thermally-conductive sheet may be made of copper, and may be set to 398 (W/(m·K)) in thermal conductivity on the surface of the thermally-conductive sheet (in X-Y direction).

Advantageous Effect of the Invention

The present invention is to provide a key sheet, a press switch, and an electronic device improved in heat radiation performance can effectively diffuse heat loss from an electronic circuit and the like.

BRIEF DESCRIPTION OF THE DRAWINGS

FIG. 6(*a*) is a diagram showing the temperature distribution on the relevant surface. FIG. 6(*b*) is a graph showing a temperature distribution along X-X line on the relevant surface.

FIG. 7(*a*) is a diagram showing the temperature distribution on the relevant surface. FIG. 7(*b*) is a graph showing a temperature distribution along X-X line on the relevant surface.

EXPLANATION OF THE REFERENCE NUMERALS

Figure 1:
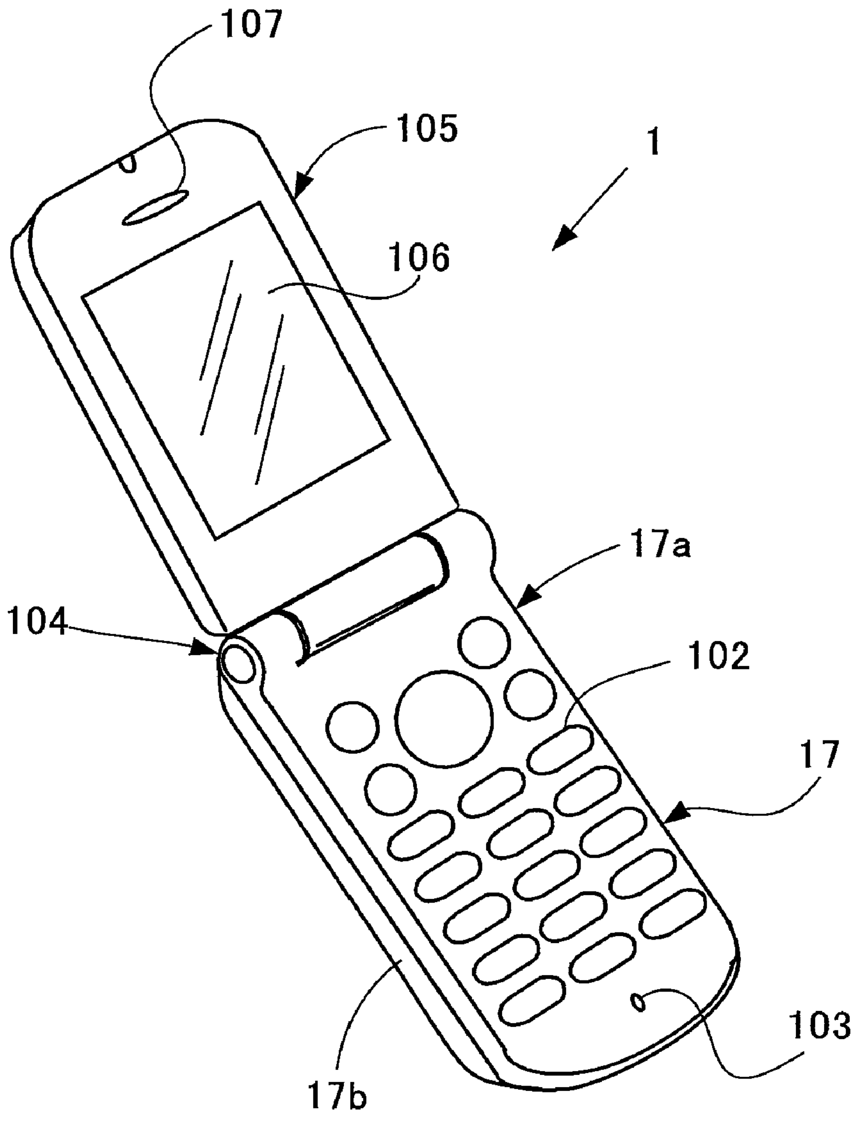
FIG. 1 is a perspective view showing an electronic device according to the first embodiment of the present invention.

1: electronic device
10 and 20: press switch
11: printed-circuit board
11*a*: first contact section
11*b*: second contact section
12: third contact section
12*c*: center section
13: electrically-insulating sheet
13*a*: click section
14 and 24: thermally-conductive sheet
15, 25 and 27: electrically-insulating cover layer
16 and 26: key sheet
16*a* and 26*a*: button section
16*b* and 26*b*: viscoelastic sheet
16*c*: projection
16*d* and 26*d*: contact section
17: lower housing
17*a*: housing member on the side to be operated
18: LED
19: heat-generating electronic component
30 and 31: area

PREFERRED EMBODIMENTS OF THE INVENTION

The preferred embodiments of the present invention will be described hereinafter with reference to accompanying drawings.

First Embodiment

Figure 2:
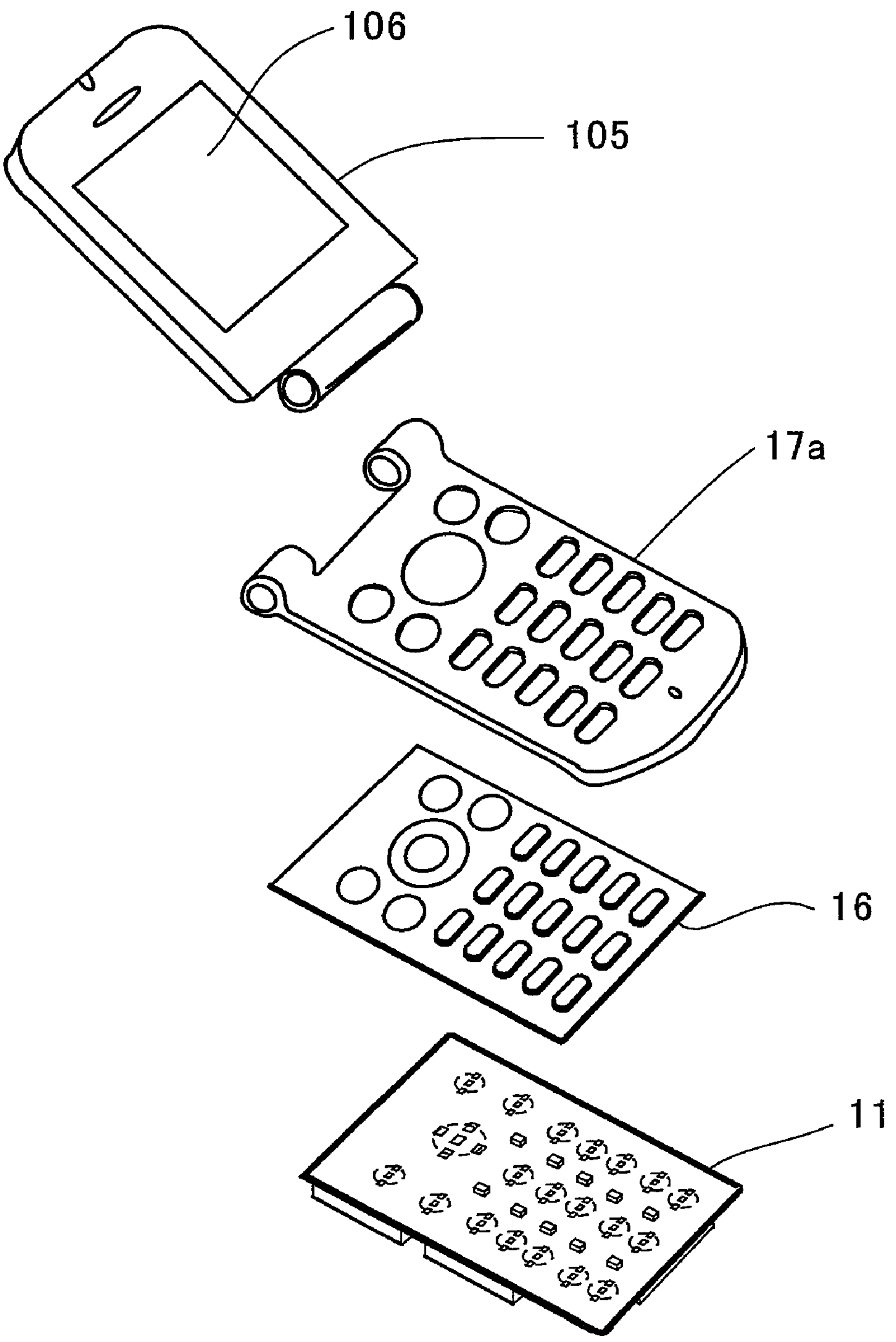
FIG. 2 is an exploded perspective view showing relevant parts of the electronic device according to the first embodiment of the present invention.

FIG. 1 is a perspective view showing an electronic device according to the first embodiment of the present invention. As shown in FIG. 1, the electronic device 1 includes a lower housing 17, an upper housing 105, and a hinge unit 104 for connecting the lower housing 17 with the upper housing 105 to allow the upper housing 105 to be pivotally movable with respect to the lower housing 17. An operating section 102 and a sound input section 103 are in the lower housing 17, while a sound output section 107 and a screen 106 are in the upper housing 105. The lower housing 17 has a housing member 17*a* on the rear side to be operated and a housing member 17*b* on the rear side. As shown in FIG. 2, a printed-circuit board 11 for communications and input/output control, and a key sheet 16 for press switches are further in the lower housing 17.

Figure 3:
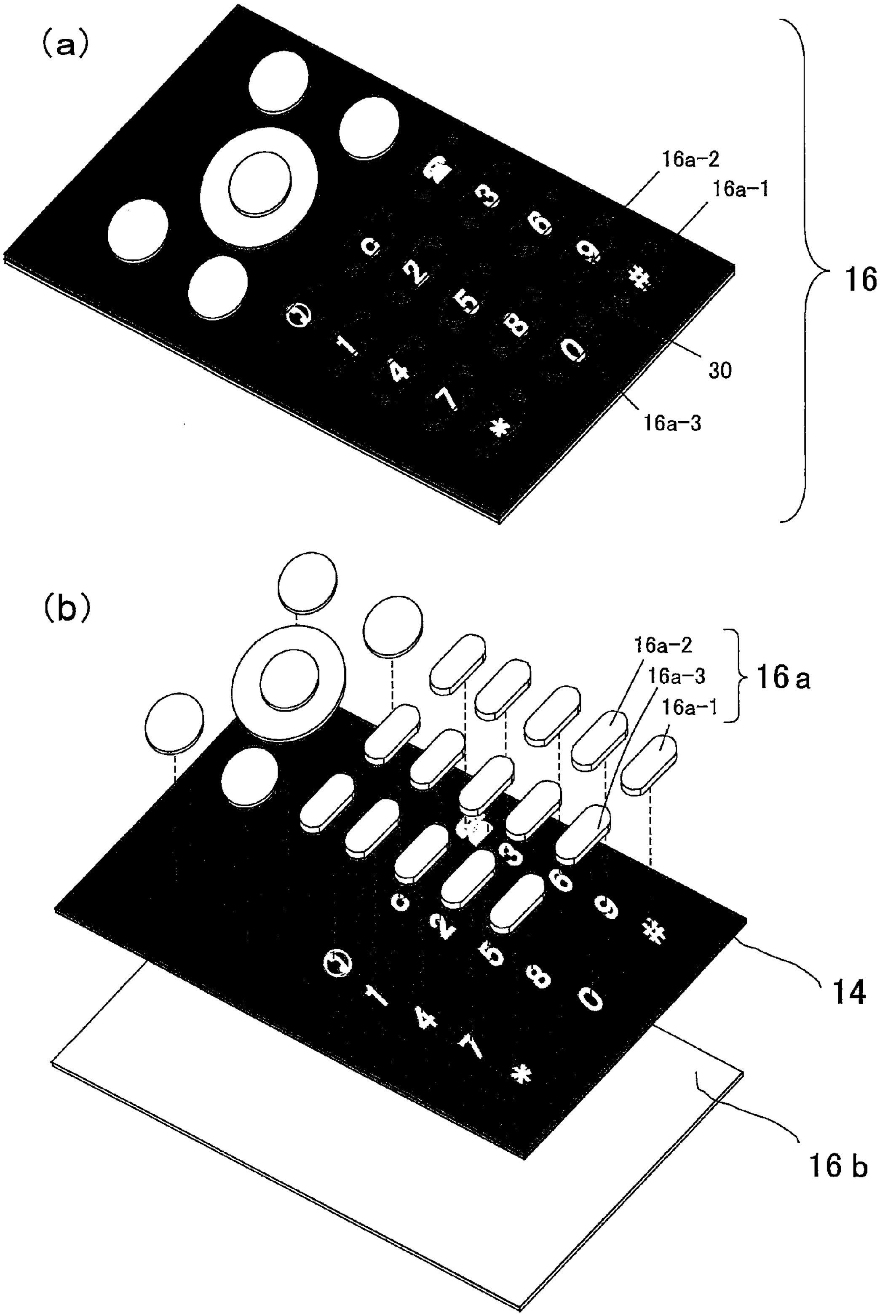
FIG. 3 is exploded perspective views showing key sheets for press switches of the electronic device according to the first embodiment of the present invention.
Figure 4:
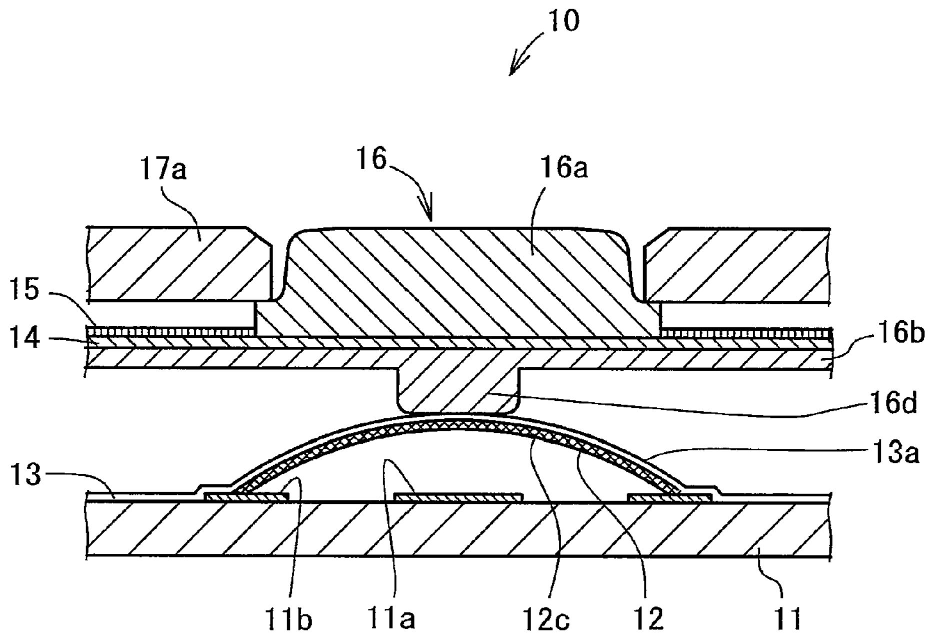
FIG. 4 is cross sectional views showing press switches of the electronic device according to the first embodiment of the present invention.

FIG. 3(*a*) is a perspective view showing a key sheet for press switches of the electronic device according to the first embodiment, while FIG. 3(*b*) is an exploded perspective view showing a key sheet for press switches of the electronic device according to the first embodiment. As shown in FIGS. 3(*a*) and 3(*b*), the key sheet 16 includes button sections 16*a* constituted by a plurality of button sections 16*a*-1, 16*a*-2, 16*a*-3, . . . , a viscoelastic sheet 16*b*, and a thermally-conductive sheet 14. FIGS. 4(*a*) and 4(*b*) are cross-sectional views showing a press switch according to the first embodiment of the present invention.

Figure 5:
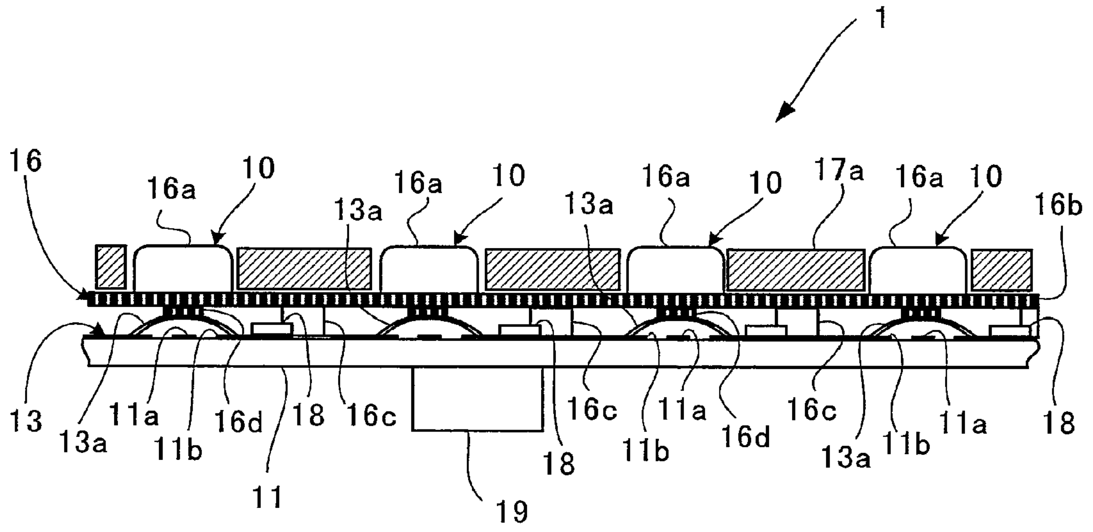
FIG. 5 is a cross sectional view showing press switches of the electronic device according to the first embodiment of the present invention.

As shown in FIG. 5, a plurality of press switches 10, each of which is shown in FIG. 4, are accommodated in the lower housing 17 of the electronic device 1 improved in size and thickness. Additionally, the electronic device 1 may be constituted by a mobile phone, a personal digital assistant (PDA), or an electronic device improved in size and thickness.

As shown in FIG. 4, the printed-circuit board 11 is covered on one surface with an electrically-insulating sheet 13. In the press switch 10 according to the first embodiment, the first and second contact sections 11*a* and 11*b* on the printed-circuit board 11 are located on the inside of a flexible click section 13*a* of the electrically-insulating sheet 13, and can be electrically connected to each other. As shown in FIG. 5, the press switches 10, the printed-circuit board 11, and the key sheet 16 are in the lower housing 17.

As shown in FIG. 5, the button sections 16*a* to be selectively pushed are operatively arranged on the flexible viscoelastic sheet 16*b* of the key sheet 16. The viscoelastic sheet 16*b* of the key sheet 16 has projections 16*c* extending from the lower surface of the viscoelastic sheet 16*b* to the electrically-insulating sheet 13, and portions 16*d* to be respectively engaged with the click sections 13*a* of the electrically-insulating sheet 13.

As shown in FIG. 4, the key sheet 16 includes a thermally-conductive sheet 14 located on the upper surface of the viscoelastic sheet 16*b*, and an insulating layer 15 located on the upper surface of the thermally-conductive sheet 14. For example, as shown in FIG. 3(*a*), the thermally-conductive sheet 14 has a portion in an area 30 surrounded by button sections 16*a*-1, 16*a*-2, and 16*a*-3 which did not located in the same straight line. Here, the thermally-conductive sheet 14 is larger in thermal conductivity than the printed-circuit board 11, the electrically-insulating sheet 13, the viscoelastic sheet 16*b*, and the front member 17*a* of the lower housing 17. The thermally-conductive sheet 14 is made from graphite sheet, metal sheet, or the like which exceeds other materials in thermal conductivity. The viscoelastic sheet 16*b* is constituted by a sheet made of silicon rubber or the like.

The electrically-insulating sheet 13 is constituted by a sheet made of electrically-insulating resin such as for example polyethylene terephthalate (PET), and an adhesive layer or an electrically-insulating adhesive layer (not shown). Further, the electrically-insulating cover layer 15 is also constituted by a sheet made of electrically-insulating resin such as for example polyethylene terephthalate (PET).

When the click section 13*a* (pressure point) is pressed, the press switch 10 of the electronic circuit assumes a conduction state by reason that the first contact section 11*a* is electrically connected to the second contact section 11*b*. The click section 13*a* of the electrically-insulating sheet 13 on the printed circuit board 11 is constituted as a circular portion projected on the operation side of the electronic device 1, and distant from the printed circuit board 11.

Additionally, the click section 13*a* may not assume a convex shape when the click section 13*a* is not in the pushed state (a state in which the electronic device is not operated through the press switch). The click section 13*a* and the center section 12*c* may assume a predetermined position when the click section 13*a* is in a released state.

Further, the electrically-insulating sheet 13 may have a restorative force necessary to assume an original position. On the other hand, a member constituted as a contact section or a member to be electrically connected to the member has a restorative force necessary to assume an original position. Therefore, the click section 13*a* has flexibility to allow the center section 12*c* of the third contact section 12 to be changed in response to a force from the button section 16*a*.

More specifically, as shown in FIG. 4, two or more second contact sections 11*b* formed on the printed-circuit board 11 are in spaced relationship with each other, the first contact section 11*a* is between the second contact sections 11*b*. As another example, two or more second contact sections 11*b* may be formed on a circumferential line of a circle under the condition that the first contact section 11*a* may be formed at a center of the circle.

As shown in FIG. 4, the third contact section 12 constituted by, for example, a metal diaphragm (dish-shaped electrically-conductive plate spring having the shape of a circular arc in cross section) is electrically connected to the second contact sections 11*b*, and adhered to the inner surface of the click section 13*a* of the electrically-insulating sheet 13.

The third contact section 12 allows the center section 12*c* to function as a movable contact point. When the button section 16*a* is pushed down by the user, the third contact section 12 sags downwards in the center in response to a force from the button section 16*a* of the key sheet 16 through the click section 13*a* of the electrically-insulating sheet 13 to assume a state in which the first section 11*a* is electrically connected to the second contact section 11*b* through the third contact section 12.

When, on the other hand, the force for pushing the button section 16*a* of the key sheet 16 is released, the third contact section 12 assumes a state in which the first contact section 11*a* is not electrically connected to the second contact section 11*b*, and restores to its original state.

The electrically-insulating sheet 13 is adhered to and retained by the printed-circuit board 11 as an insulation protection layer, while the third contact section 12 is adhered to the electrically-insulating sheet 13.

The electrically-insulating cover layer 15 is adhered to the thermally-conductive sheet 14 as an insulation protection layer. The thermally-conductive sheet 14 is located throughout all parts of the body. The upper surface and the peripheral portion of the thermally-conductive sheet 14 are covered with the electrically-insulating sheet 15. It is preferable that the peripheral portion of the thermally-conductive sheet 14 be electrically insulated by the electrically-insulating sheet 15.

In this embodiment, the third contact section 12 is retained and adhered by an adhesive layer (not shown) to the click section 13*a* of the electrically-insulating sheet 13 under the condition that the lower portions of the third contact section 12 are positioned and electrically connected to the second contact sections 11*b* on the printed-circuit board 11.

The key sheet 16 is located along one side of the electrically-insulating sheet 13, while the printed-circuit board 11 is located along the other side of the electrically-insulating sheet 13. The button sections 16*a* operatively arranged on the key sheet 16 are exposed as keys through openings of the housing member 17*a* on the side to be operated. On the other hand, the contact sections 16*d* from the lower side of the key sheets 16 are respectively in contact with the click section 13*a* of the electrically-insulating sheet 13.

As shown in FIG. 5, light-emitting members such as for example LEDs (light emitting diodes) 18 are mounted on the upper side of the printed-circuit board 11, in other words, a surface facing the key sheet 16, and used to illuminate, from the inside of the lower housing 17, the button sections 16*a* such as for example keys and the like to be used to input numbers and characters. On the other hand, heat generating components 19 such as power amplifiers and other electronic components are mounted on the lower side of the printed-circuit board 11, and generate heat loss in the lower housing 17.

In the electronic device 1, a plurality of electronic components (not shown) are mounted on the printed-circuit board 11 as a control circuit for communications and input/output control and accommodated in the lower housing 17. When the electronic device 1 is running, heat generating components 19 such as power amplifiers and the like mounted on the printed-circuit board 11 generates heat loss in the lower housing 17. As a result, the heat generating components 19 and its surrounding components are heated, and produce an increase in temperature the inside of the lower housing 17.

In this state, heat loss from the printed-circuit board 11 is diffused through the thermally-conductive sheet 14 formed along the viscoelastic sheet 16*b* of the key sheet 16 (in a spreading direction). As a result, the printed-circuit board 11 can suppress local elevation of temperature of the button sections 16*a* and the housing member 17*a* in the vicinity of the heat generating components 19 of the electronic device 1.

In the conventional press switch disclosed in the patent document 1, a thermally-conductive sheet in contact with the printed-circuit board is covered with an electrically-conductive film and a key sheet, and away from external air. As a result, it is difficult to effectively diffuse heat loss from the heat-generating electronic component 19. The heat radiation performance is decreased. On the other hand, the heat radiation performance of the electronic device 1 is increased by reason that the thermally-conductive sheet 14 included in the key sheet 16 is close to external air in the press switch 10 according to the first embodiment.

The thermally-conductive sheet 14 is improved in radiation effect under the condition that, for example, the thermally-conductive sheet 14 is made of graphite, and 700 or more (W/(m·K)) in thermal conductivity in the direction of the thermally-conductive sheet 14. As a result, thermally-conductive sheet 14 can be reduced in thickness to 100 μm or less. Therefore, the key sheet 16 is reduced in thickness. The electronic device 1 can be further reduced in thickness by comprising a press switch 10 reduced in thickness.

Figure 6:
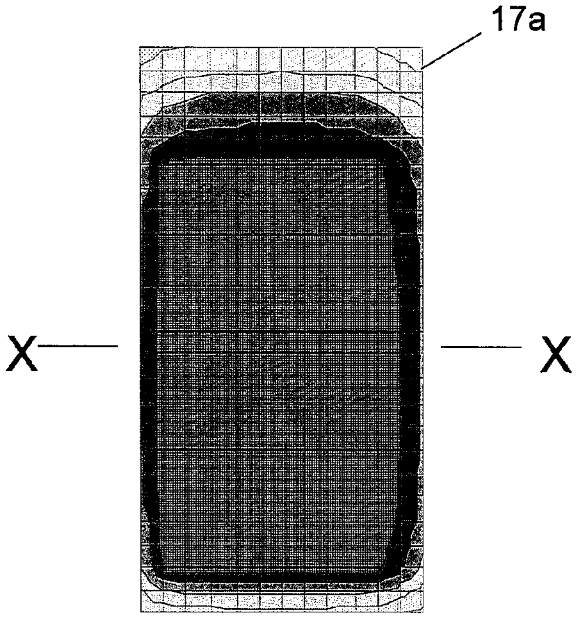
FIG. 6 is a diagram showing a result obtained from a simulation on the temperature distribution of a relevant surface of the electronic device according to the first embodiment of the present invention.
Figure 6:
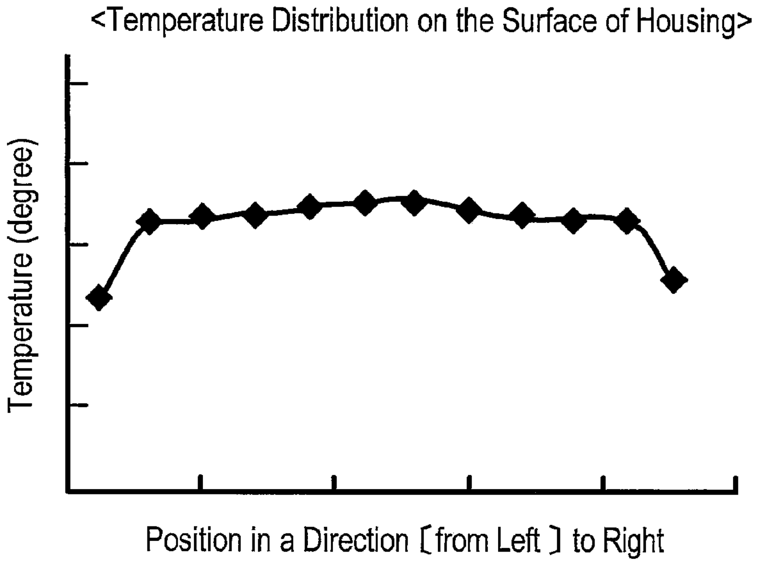

FIG. 6 is a diagram showing a result obtained from a computer simulation on the temperature distribution of the housing member 17*a* on the basis of position, heat loss, and the like of the heat-generating electronic component 19 of the electronic device according to the first embodiment of the present invention. FIG. 6(*a*) is a diagram showing the temperature distribution of the housing member as a result obtained from a computer simulation. FIG. 6(*b*) is a graph showing the temperature distribution of the cross section taken along the line X-X shown in FIG. 6(*a*).

The computer simulation has been executed under the condition that the housing member 17*a* on the side to be operated is 0.9 millimeters in thickness and 0.3 (W/(m·K)) in thermal conductivity, the printed-circuit board 11 is 0.5 millimeters in thickness and 35 (W/(m·K)) in thermal conductivity, the viscoelastic sheet 16*b* is 0.5 millimeters in thickness (the height of the viscoelastic sheet 16*b* above the lower end of the projection 16*c* is 0.1 millimeters) and 0.2 (W/(m·K)) in thermal conductivity, the heat-generating electronic component 19 is 1.0 millimeters in thickness and 1 (W/(m·K)) in thermal conductivity, the thermally-conductive sheet 14 is constituted by a sheet made of graphite, the electrically-insulating sheet 13 is 0.1 millimeters in thickness and 700 (W/(m·K)) in thermal conductivity (in a direction along its surface), and the printed-circuit board 11 has a section corresponding to the button sections 16*a*, the section is covered with the electrically-insulating sheet 13.

From this computer simulation, it will be understood that, in the electronic device 1 according to the first embodiment, the temperature of the housing member 17*a* is equalized within the section covered with the electrically-insulating sheet 13, and kept below the designated level. Further, from FIG. 6(*b*), it will be understood that the peripheral portion of housing (both ends in horizontal) is hardly influenced by heat loss from the electronic circuit, and the local elevation of temperature of the section to be operated is kept within a few degrees.

Figure 7:
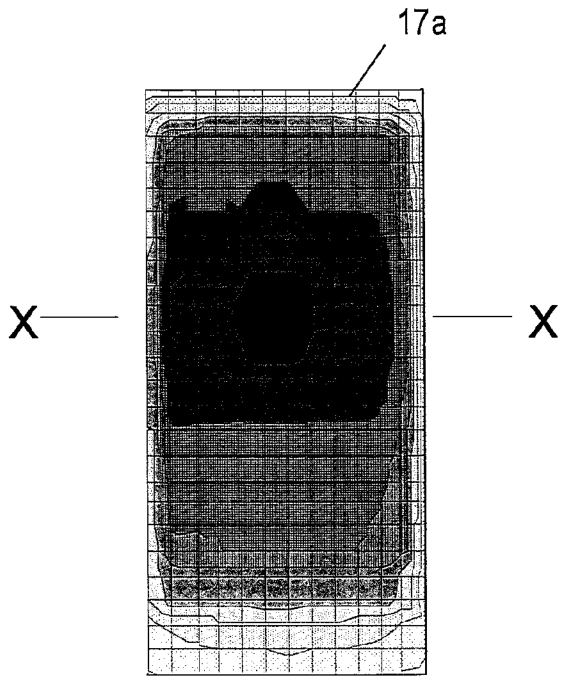
FIG. 7 is a diagram showing a result obtained from a contrastive simulation on the temperature distribution of the relevant surface of the electronic device.
Figure 7:
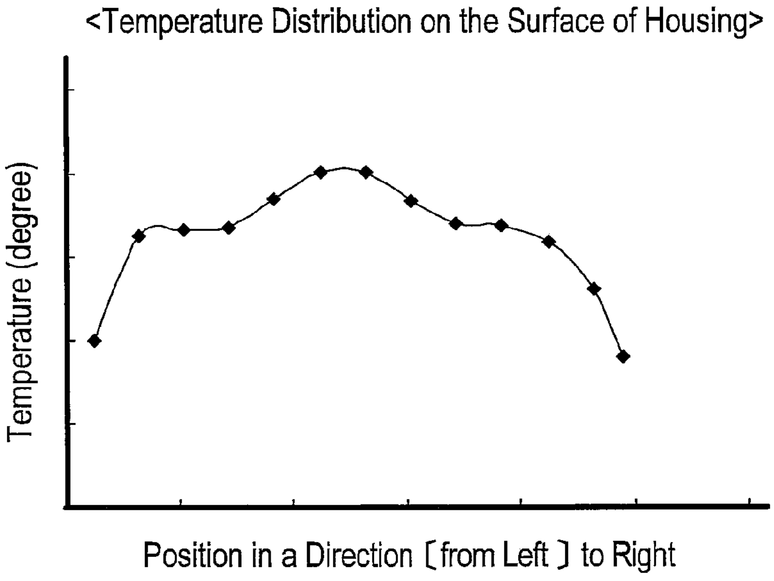

On the other hand, FIG. 7 is a view showing a result obtained from a contrastive computer simulation on the temperature distribution of the operational surface of the housing member of the electronic device under the condition that the thermally-conductive sheet 14 is limited in size by the button section 16*a*. FIG. 7(*a*) is a view schematically showing the temperature distribution zoned by isothermal lines over the operational surface of the housing member of the electronic device. FIG. 7(*b*) is a graph showing a temperature distribution of a cross section taken along the X-X line shown in FIG. 7(*a*).

In this case, the temperature distribution of the electronic device shown in FIG. 7(*a*) is influenced by heat loss from the heat generating electronic component, and not even. On the other hand, the temperature distribution of the electronic device shown in FIG. 7(*b*) is even without being influenced by heat loss from the heat generating electronic component.

From a result obtained from a computer simulation on the first embodiment shown in FIG. 6 and a result obtained from a contrastive computer simulation shown in FIG. 7, it will be understood that the electronic device 1 according to the first embodiment of the present invention effectively prevent local elevation of temperature resulting from heat loss from the heat-generating electronic component 19 and its vicinity by enhancing an even distribution effect of heat loss along the surface of the key sheet 16.

The button sections 16*a* of the key sheet 16 can be illuminated with light from light emitting diodes 18 mounted on the printed-circuit board 11 through openings of the thermally-conductive sheet 14. The button section 16*a* of the key sheet 16 can be illuminated with light from the light emitting diode 18 mounted on the printed-circuit board 11 through character-shaped openings of the thermally-conductive sheet 14.

In this embodiment, the electrically-insulating cover layer 15 or the viscoelastic sheet 16*b* has a notched section corresponding to a contact section (not shown), the thermally-conductive sheet 14 is exposed and electrically connected to the grounded pattern of the printed-circuit board 11 through conductive layer and metal spring. Therefore, the thermally-conductive sheet 14 electrically connected to the grounded pattern of the printed-circuit board 11 can prevent the electronic device 1 from functioning improperly by preventing static electrical charge from flowing into each contact section.

The electronic device can be improved without being increased in the number of assembling process by reason that the key sheet 16 includes a thermally-conductive sheet 14 provided along the viscoelastic sheet 16*b*, the thermally-conductive sheet 14 is stacked when the key sheet 16 is mounted on the electronic device.

Even if the thermally-conductive sheet made of graphite is reduced in thickness, the thermally-conductive sheet reduced in thickness can be enhanced in thermal conductivity on the basis of conventionally-known technique for enhancing the thermal conductivity of the thermally-conductive sheet made of graphite and reduced in thickness.

Figure 8:
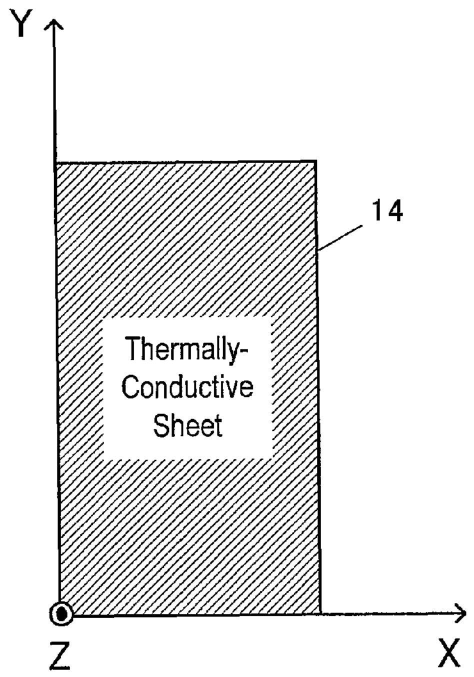
FIG. 8 is a view showing specific values of thermal conductivity of the thermal conductive sheet.

FIG. 8 is a diagram showing a table of specific values in thermal conductivity of the thermally-conductive sheet. As shown in FIG. 8, the thermally-conductive sheet may be made of graphite, and set to 700 (W/(m·K)) in thermal conductivity in a direction based on the surface of the thermally-conductive sheet (in X-Y direction) under the condition that the thermally-conductive sheet is 100 μm in thickness (in Z-direction). The thermally-conductive sheet may be 850 (W/(m·K)) in thermal conductivity in a direction based on the surface (in X-Y direction) under the condition that the thermally-conductive sheet made of graphite is 70 μm in thickness (in Z-direction). The thermally-conductive sheet made of graphite may be 1600 (W/(m·K)) in thermal conductivity in a direction based on the surface (in X-Y direction) under the condition that the thermally-conductive sheet made of graphite is 25 μm in thickness (in Z-direction).

As another example, the thermally-conductive sheet may be made of aluminum, and set to 237 (W/(m·K)) in thermal conductivity in a direction based on the surface of the thermally-conductive sheet (in X-Y direction). The thermally-conductive sheet may be made of copper, and set to 398 (W/(m·K)) in thermal conductivity in a direction based on the surface of the thermally-conductive sheet (in X-Y direction).

Second Embodiment

Figure 9:
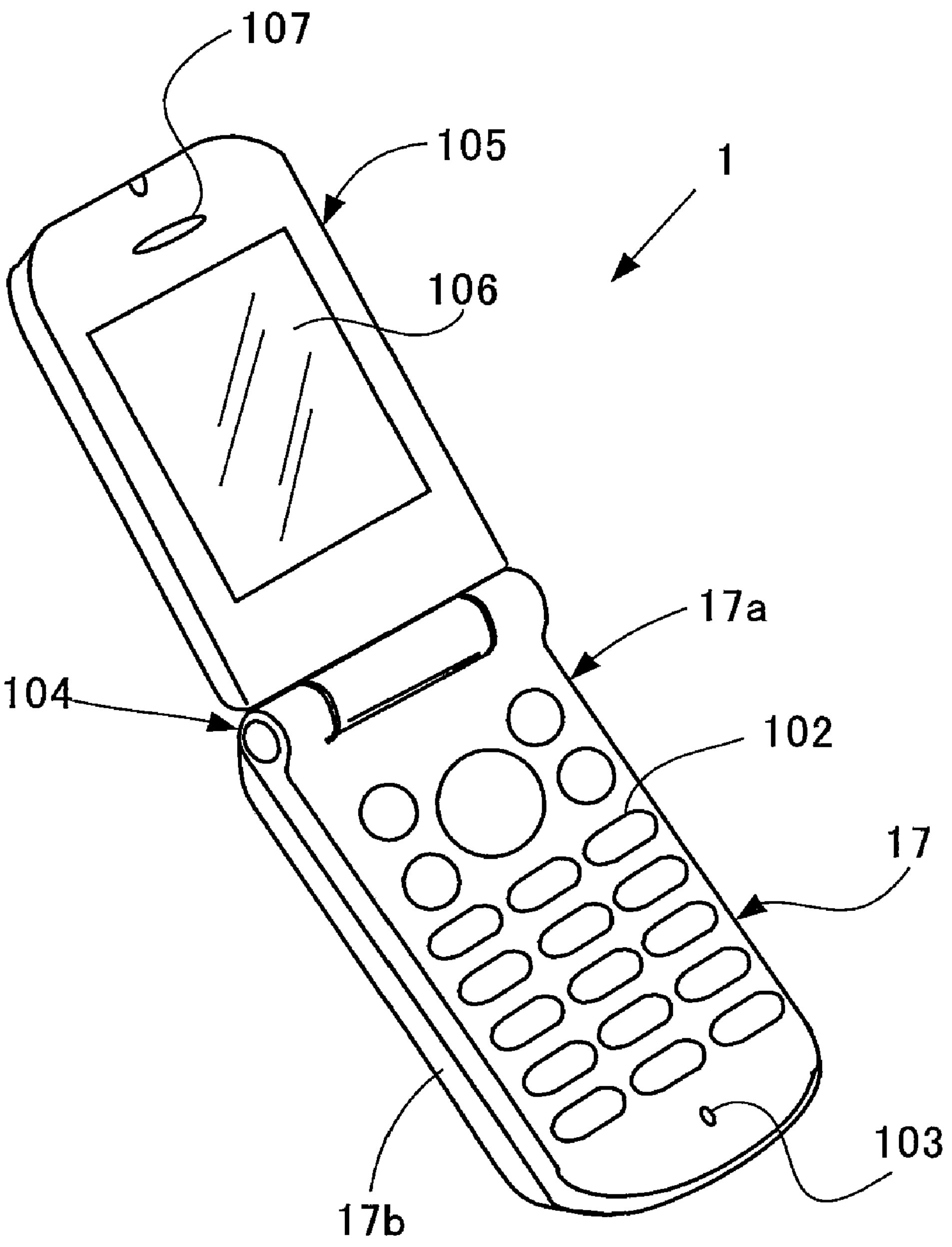
FIG. 9 is a perspective view showing an electronic device according to the second embodiment of the present invention.

FIG. 9 is a perspective view showing the outline of an electronic device according to the second embodiment of the present invention. As shown in FIG. 9, the electronic device according to the second embodiment is the same in appearance as the electronic device according to the first embodiment. The constitutional units of the electronic device according to the second embodiment substantially the same in construction as those of the electronic device according to the first embodiment will be simply described hereinafter and bear the same reference characters as those of the electronic device according to the first embodiment. On the other hand, the difference between the electronic devices according to the first and second embodiments will be described in detail hereinafter.

Figure 10:
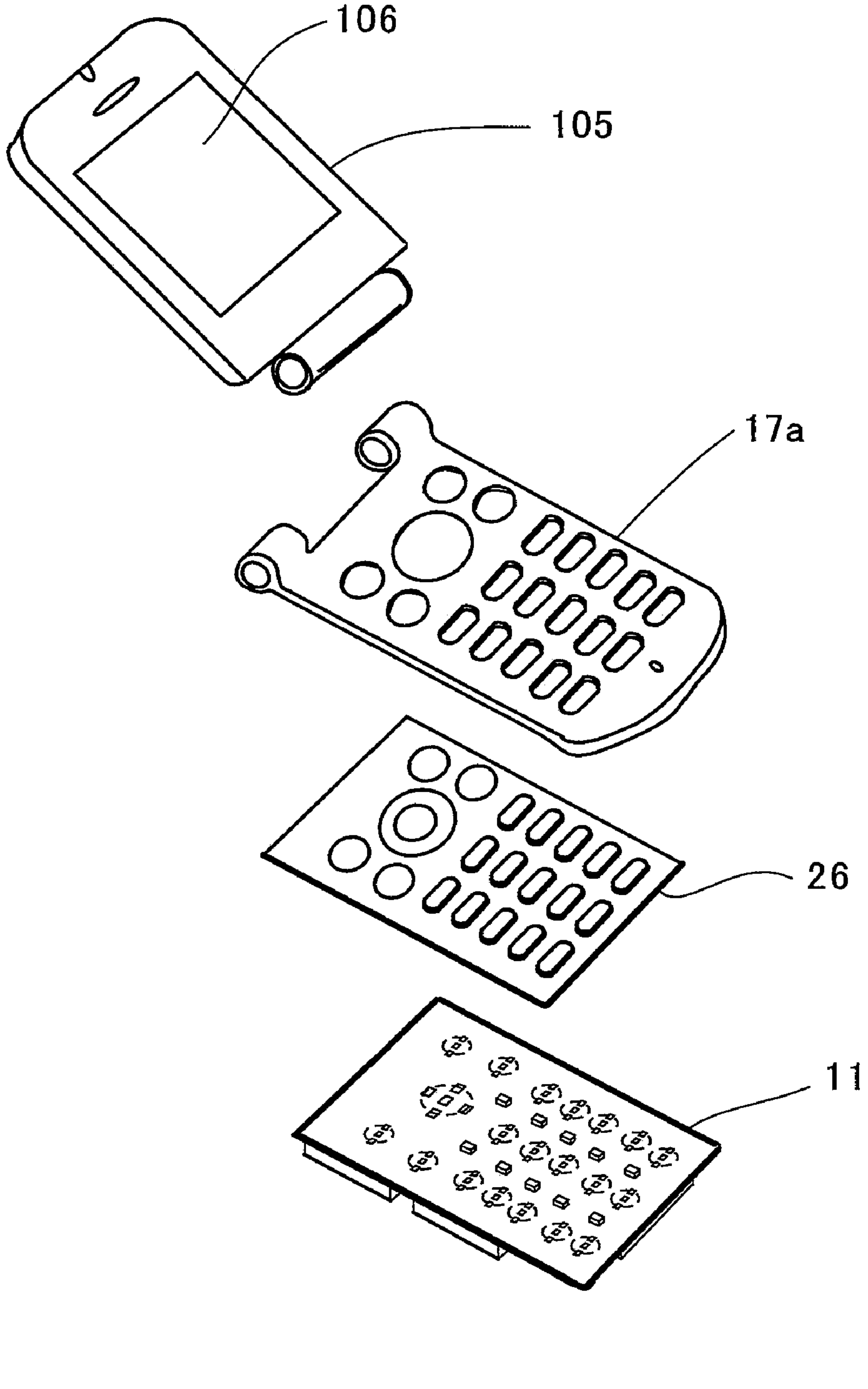
FIG. 10 is an exploded perspective view showing relevant parts of the electronic device according to the second embodiment of the present invention.
Figure 11:
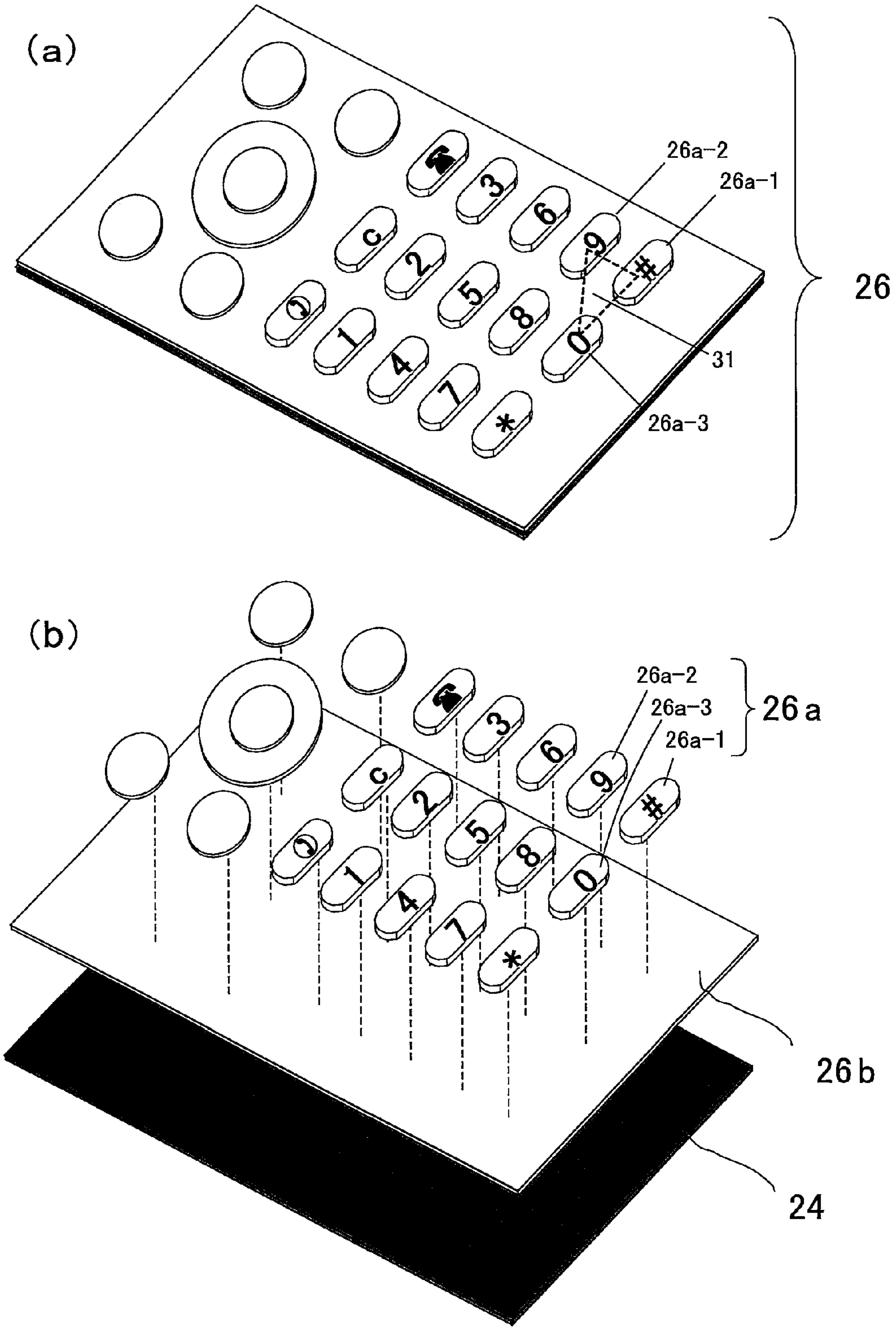
FIG. 11 is exploded perspective views showing key sheets for press switches of the electronic device according to the second embodiment of the present invention.
Figure 12:
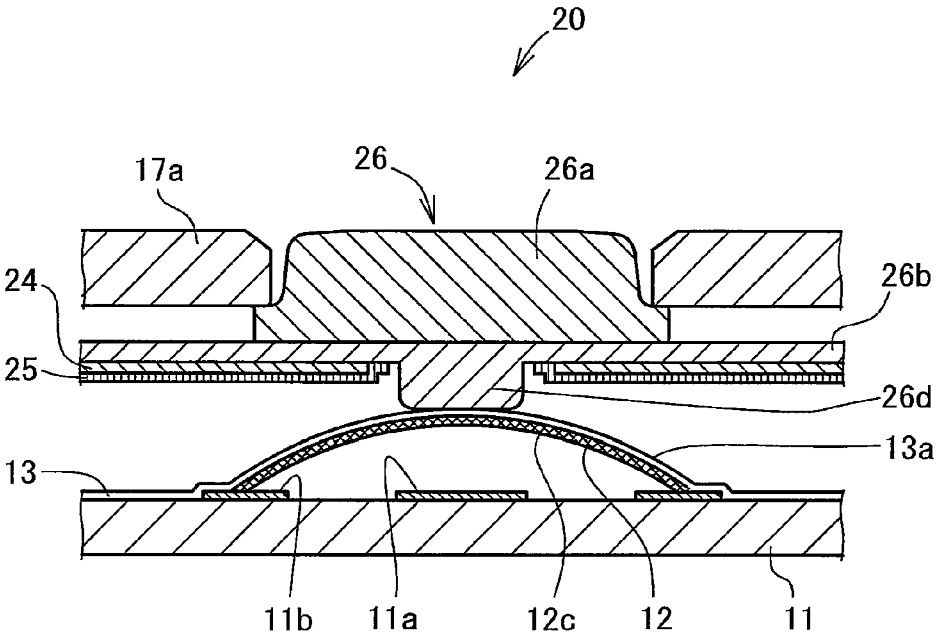
FIGS. 12(*a*) and 12(*b*) are cross sectional views showing press switches of the electronic device according to the second embodiment of the present invention.
Figure 12:
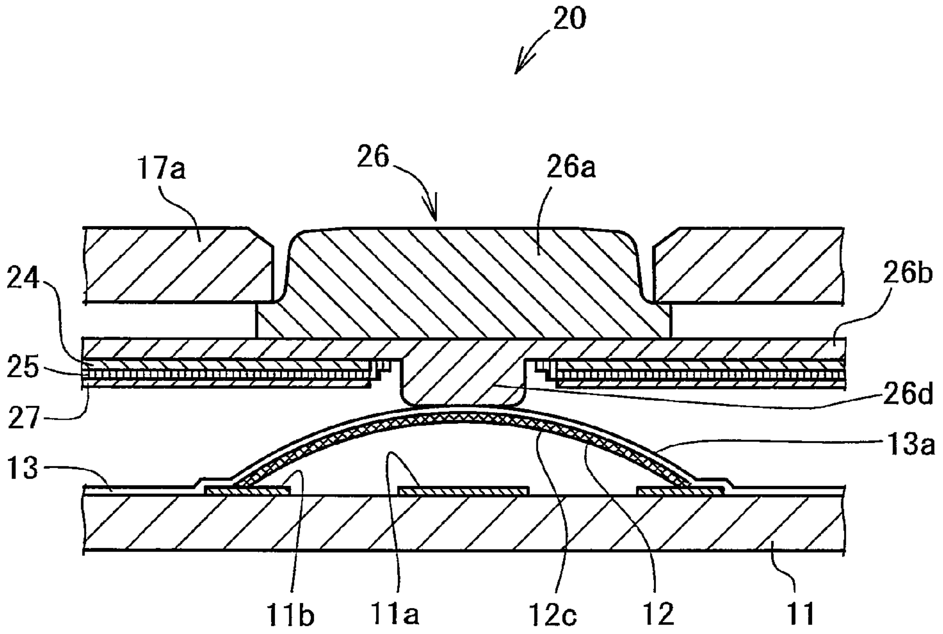
Figure 13:
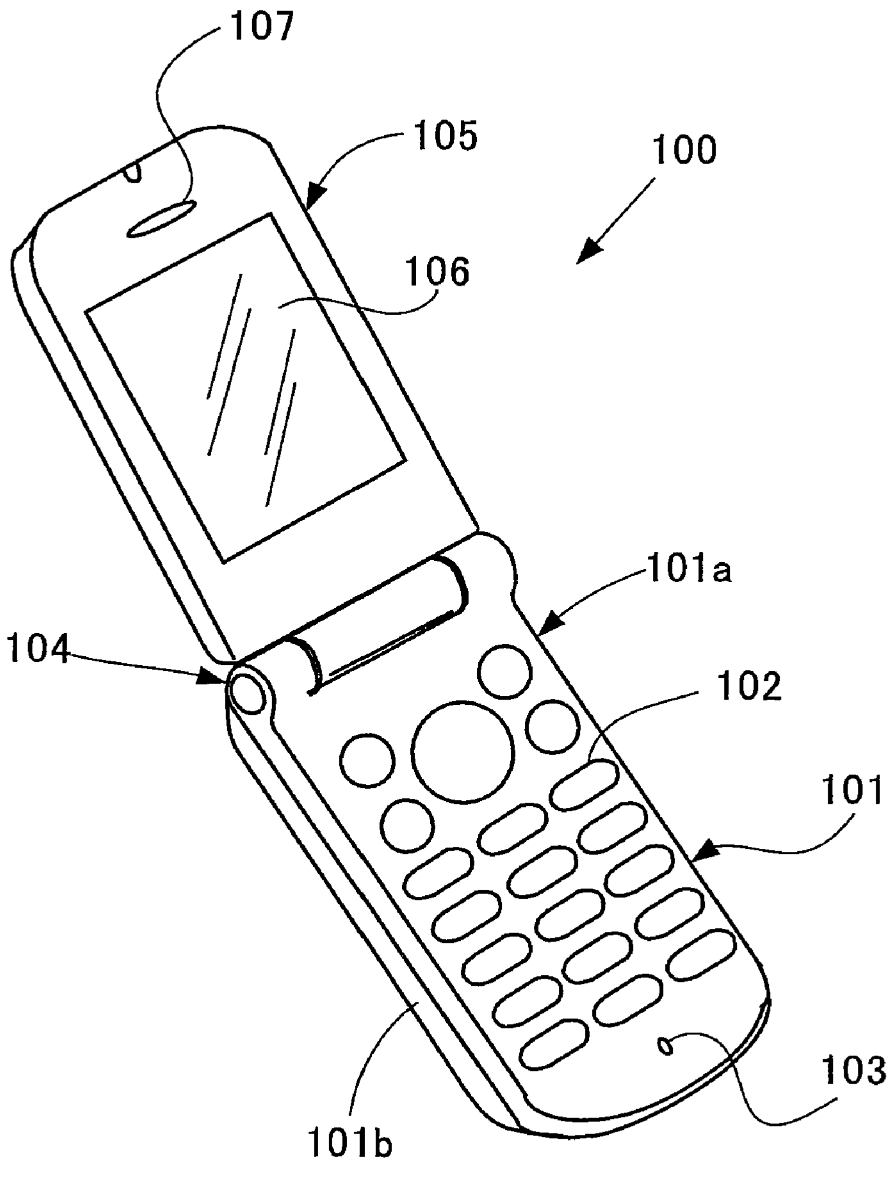
FIG. 13 is a perspective view showing a conventional electronic device.
Figure 14:
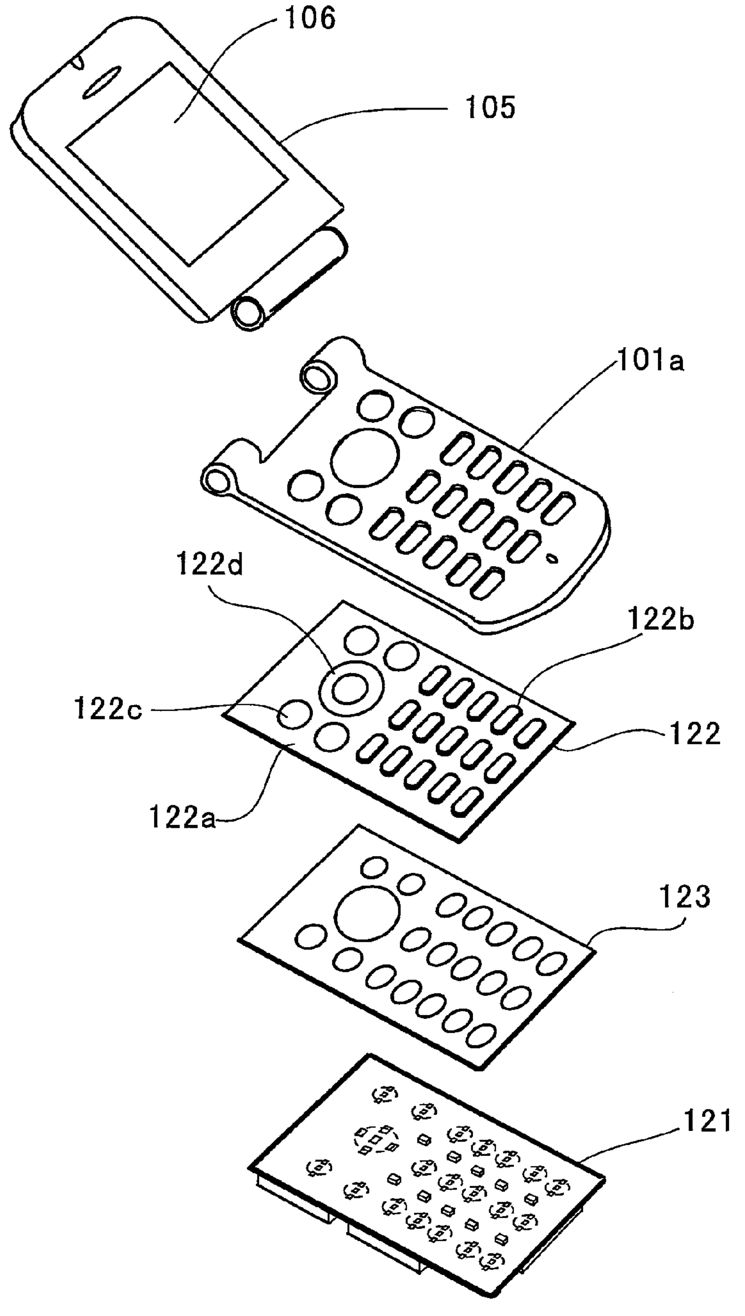
FIG. 14 is an exploded perspective view showing relevant parts of the conventional electronic device.
Figure 15:
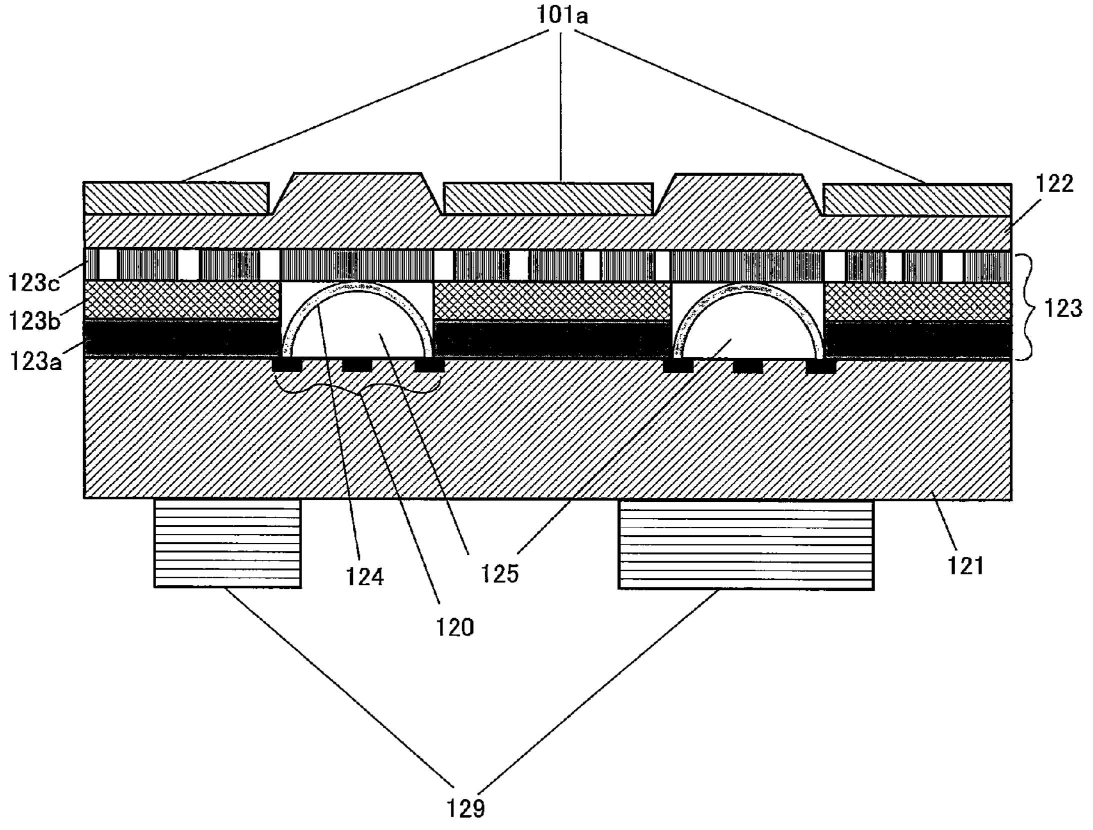
FIG. 15 is a cross sectional view showing press switches of the conventional electronic device.

As shown in FIG. 10, a lower housing 17 is equipped with a printed-circuit board 11 for communication and input/output controls and a key sheet 26 for press switches are in. FIG. 11(*a*) is a perspective view showing a key sheet 26 for press switches of the electronic device according to the second embodiment of the present invention, while FIG. 11(*b*) is an exploded perspective view showing a key sheet 26 for press switches of the electronic device according to the second embodiment of the present invention. The key sheet 26 includes a plurality of button sections 26*a*-1, 26*a*-2, 26*a*-3, . . . , a viscoelastic sheet 26*b*, and a thermally-conductive sheet 24. FIGS. 12(*a*) and 12(*b*) are cross-sectional views showing a press switch according to the second embodiment of the present invention.

As shown in FIG. 12(*a*), the printed-circuit board 11 has a surface covered with an electrically-insulating sheet 13. In the press switch 20 according to the second embodiment, the first and second contact sections 11*a* and 11*b* formed on the printed-circuit board 11 are just below a flexible click section 13*a* of the electrically-insulating sheet 13. The press switch 20 assumes an operation state in which the first and second contact sections 11*a* and 11*b* are electrically connected with each other when the click section 13*a* is pushed to the first contact section 11*a*. The press switch 20 and the printed-circuit board 11 are in the lower housing 17 of the electronic device 1. Further, the key sheet 26 is in the lower housing 17.

More specifically, as shown in FIG. 12(*a*), the first contact section 11*a* is located between the second contact sections 11*b* electrically connected to the third contact section 12 formed on the click section 13*a*.

The third contact section 12 sags downwards in the center in response to a force from the button section 26*a* of the key sheet 26 through the click section 13*a* of the electrically-insulating sheet 13 to assume a state in which the first contact section 11*a* is electrically connected to the second contact section 11*b* through the third contact section 12. When, on the other hand, the force from the button section 26*a* of the key sheet 26 through the click section 13*a* of the electrically-insulating sheet 13 is released from the third contact section 12, the third contact section 12 is away from the first contact section 11*a* to assume a state in which the first contact section 11*a* is not electrically connected to the second contact section 11*b* through the third contact section 12.

More specifically, as shown in FIG. 12(*a*), the third contact section 12 is adhered to and retained by the electrically-insulating sheet 13, and adhered to the printed-circuit board 11.

On the other hand, the key sheet 26 includes a thermally-conductive sheet 24 and an electrically-insulating cover layer 25 on the opposite side of the button sections 26*a*. Here, the thermally-conductive sheet 24 is larger in thermal conductivity the electrically-insulating cover layer 25 of the key sheet 26 and the printed-circuit board 11, and may be made of, for example, graphite or metal. The electrically-insulating cover layer 25 may be made of, for example, resin such as for example polyethylene terephthalate.

Here, each of the thermally-conductive sheet 24 and the electrically-insulating cover layer 25 has, for example, a circular-shaped opening based on the profile shape of the contact section 26*d* of the key sheet 26. As shown in FIG. 12(*a*), the thermally-conductive sheet 24 has an inner peripheral section overlapped with the electrically-insulating cover layer 25.

As shown in FIG. 12(*a*), the key sheet 26 according to the second embodiment is constituted by an integrally formed three-layered sheet including an electrically-insulating cover layer 25, a thermally-conductive sheet 24, and a viscoelastic sheet 26*b*.

As shown in FIG. 11(*a*), the thermally-conductive sheet 24 has a portion in an area 30 surrounded by button sections 26*a*-1, 26*a*-2, and 26*a*-3 which did not located in the same straight line. The remaining parts of the key sheet according to the second embodiment are the same in construction as those of the key sheet according to the first embodiment.

From the foregoing description, it will be understood that the key sheet according to the second embodiment of the present invention can effectively diffuse heat loss from the printed-circuit board 11 to prevent local elevation of temperature by reason that the heat loss from the printed-circuit board 11 is diffused through the thermally-conductive sheet 24 located along the viscoelastic sheet 26*b*.

Further, the button sections 26*a* of the key sheet 26 can be evenly illuminated with light from the light emitting diode mounted on the printed-circuit board 11 through an opening of the contact section of the thermally-conductive sheet 24.

In the second embodiment, the button section 26*a* of the key sheet 26 can be evenly illuminated with light from the light emitting diode mounted on the printed-circuit board 11 through an opening for the contact section 26*d* by reason that part or all of the electrically-insulating cover layer 25.

As shown in 12(*b*), the electrically-insulating cover layer 25 may be constituted by a transparent sheet. The electrically-insulating sheet 27 may be constituted by a white or glossy sheet. Additionally, the electrically-insulating sheet 27 may be constituted by a white or glossy sheet made of resin such as for example polyethylene terephthalate, and may have openings based on the profile shape of the contact sections 26*d* of the key sheet 26.

In the key sheet thus constructed, the opening of the electrically-insulating sheet 27 is larger in size than that of the transparent electrically-insulating sheet, and smaller in size than or equal to that of the thermally-conductive sheet. As a result, the passage of light from the LED 18 mounted on the printed-circuit board 11 to the button section 26*a* of the key sheet 26 can be increased in comparison with the construction shown in FIG. 12(*a*). Therefore, the illumination of the button section 26*a* can further increased.

In the second embodiment, the thermally-conductive sheet 24 is electrically connected to the grounded pattern of the printed-circuit board 11 through conductive layer and metal spring. As a result, the thermally-conductive sheet 14 electrically connected to the grounded pattern of the printed-circuit board 11 can prevent the electronic device 1 from functioning improperly by preventing static electrical charge from flowing into each contact section.

From the foregoing description, it will be understood that the electronic device according to the second embodiment of the present invention can be improved without being increased in the number of assembling processes by reason that the key sheet 26 is constituted by a layered sheet including a thermally-conductive sheet 24 located along the viscoelastic sheet 26*b*.

INDUSTRIAL APPLICABILITY

From the foregoing description, it will be understood that the key sheet according to the present invention can effectively diffuse heat loss from heat-generating electronic components to prevent local elevation of temperature by reason that the heat loss from heat-generating electronic components is diffused through the thermally-conductive sheet located along the viscoelastic sheet, and useful for a small and thin-model electronic device to be frequently carried and touched with one's hand.

The invention claimed is:

1. A key sheet, comprising:

a elastic sheet having a elastic property, and having a first surface and a second surface;

a button section located on the side of said first surface of said elastic sheet to be pushed; and a contact section projected from said first surface toward said second surface of said elastic sheet, said contact section occupies a position corresponding to said button section on said second surface of said elastic sheet; and a thermally-conductive sheet having a character-shaped opening and a thermal conductivity equal to a specific value, wherein said first surface of said elastic sheet is in contact with said second surface of said thermally-conductive sheet, said button section includes a first button section, a second button section, and a third button section which is not on a straight line passing through said first and second button sections, and said thermally-conductive sheet is within an area identified by said first to third button sections.

2. A key sheet according to claim 1, further comprising:

an electrically-insulating cover layer having an insulating property, said electrically-insulating cover layer being in contact with said first surface of said thermally-conductive sheet for bonding to said elastic sheet with covering a peripheral section of said thermally-conductive sheet.

3. A key sheet according to claim 1, wherein said thermally-conductive sheet has an opening, and said button section is located corresponding to said opening with being in contact with said first surface of said elastic sheet.

4. A key sheet, comprising:

a elastic sheet having a elastic property, and having a first surface and a second surface;

a button section located on the side of said first surface of said elastic sheet to be pushed; and a contact section projected from said first surface toward said second surface of said elastic sheet, said contact section occupies a position corresponding to said button section on said second surface of said elastic sheet; and a thermally-conductive sheet having a character-shaped opening and a thermal conductivity equal to a specific value, wherein said second surface of said elastic sheet is in contact with said first surface of said thermally-conductive sheet.

5. A key sheet according to claim 4, wherein said thermally-conductive sheet has an opening, and said contact section located corresponding to said opening.

6. A key sheet according to claim 4, further comprising:

an electrically-insulating cover layer having an insulating property, said electrically-insulating cover layer being in contact with said second surface of said thermally-conductive sheet for bonding to said elastic sheet with covering a peripheral section of said thermally-conductive sheet.

7. A key sheet according to claim 6, wherein said electrically-insulating cover layer has a visible light reflective property.

8. A key sheet according to claim 1 or claim 4, wherein said thermally-conductive sheet is constituted by a sheet made of graphite.

9. A key sheet according to claim 4, wherein said button section includes a first button section, a second button section, and a third button section which is not on a straight line passing through said first and second button sections, and said thermally-conductive sheet is in an area identified by said first to third button sections.

10. A press switch, comprising:

a printed-circuit board provided with an electronic circuit, said printed-circuit board having a first surface and a second surface;

a switch section located on said first surface of said printed-circuit board, said switch section having a push point to change the connection state of said electronic circuit, and a key sheet defined in claim 1, and located in relation to said push point.

11. A press switch according to claim 10, wherein said thermally-conductive sheet is constituted by a sheet made of electrically-conductive material, and said printed-circuit board has an electrically-conductive layer electrically connected to said thermally-conductive sheet.

12. An electronic device, comprising a press switch defined in claim 10.

13. A press switch, comprising: a printed-circuit board provided with an electronic circuit, said printed-circuit board having a first surface and a second surface; a switch section located on said first surface of said printed-circuit board, said switch section having a push point to change the connection state of said electronic circuit, and a key sheet defined in claim 4, and located in relation to said push point.

14. A press switch according to claim 13, wherein said thermally-conductive sheet is constituted by a sheet made of electrically-conductive material, and said printed-circuit board has an electrically-conductive layer electrically connected to said thermally-conductive sheet.

15. An electronic device, comprising a press switch defined in claim 13.

* * * * *